(12) United States Patent
Aki et al.

(10) Patent No.: US 7,176,473 B2
(45) Date of Patent: Feb. 13, 2007

(54) SHIELDING LEADFRAME FOR SEMICONDUCTORS FOR OPTICAL COUPLING AND ELECTRONIC APPARATUS INCLUDING SAME

(75) Inventors: Motonari Aki, Nara (JP); Taiji Maeda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 50 days.

(21) Appl. No.: 10/980,264

(22) Filed: Nov. 4, 2004

(65) Prior Publication Data
US 2005/0116145 A1 Jun. 2, 2005

(30) Foreign Application Priority Data
Nov. 27, 2003 (JP) ............... 2003-397479

(51) Int. Cl.
*G02B 27/00* (2006.01)
(52) U.S. Cl. .......................... 250/551; 257/80
(58) Field of Classification Search ............... 250/551, 250/239; 257/666, 676, 80–82; 438/24–26, 438/111, 112
See application file for complete search history.

(56) References Cited

U.S. PATENT DOCUMENTS 4,745,294 A * 5/1988 Kohashi et al. ............. 250/551
5,665,983 A * 9/1997 Nagano ....................... 257/81
5,811,797 A * 9/1998 Kobachi et al. ............. 250/239
6,396,127 B1 * 5/2002 Munoz et al. ............... 257/666
2003/0127711 A1 * 7/2003 Kawai et al. ................ 257/666

FOREIGN PATENT DOCUMENTS

| JP | 62-247575 A | | 10/1987 |
| JP | 7-7099 A | | 1/1995 |
| JP | 10163518 A | * | 6/1998 |
| JP | 11054790 A | * | 2/1999 |
| JP | 2000040839 A | * | 2/2000 |

* cited by examiner

*Primary Examiner*—Thanh X. Luu
(74) *Attorney, Agent, or Firm*—Birch, Stewart, Kolasch & Birch, LLP

(57) ABSTRACT

An optical semiconductor element includes a light-emitting element, a light-receiving element that is placed opposite to the light-emitting element, and two lead frames on which the light-emitting element and the light-receiving element are respectively die bonded. Shield plates are bent respectively toward the light-emitting element or the light-receiving element at a predetermined angle with respect to the surface of a die bonding region on the periphery of the die bonding region of the lead frames.

15 Claims, 8 Drawing Sheets

SHIELDING LEADFRAME FOR SEMICONDUCTORS FOR OPTICAL COUPLING AND ELECTRONIC APPARATUS INCLUDING SAME

BACKGROUND OF THE INVENTION

This application claims priority under 35 U.S.C § 119(a) on patent application No. 2003-397479 filed in Japan on Nov. 27, 2003, the entire contents of which are hereby incorporated by reference.

The present invention relates to an optical semiconductor element in which a light-emitting element and a light-receiving element are placed directly opposite to each other. The present invention relates especially to optical semiconductor elements and electronic devices using such optical semiconductor elements that require an improvement of resistance against noise from electromagnetic waves from circuits within the electronic devices as well as electromagnetic waves from outside the electronic devices.

As mobile phones, wireless LANs that comply with the wireless LAN (Local Area Network) standard IEEE (Institute of Electrical & Electronics Engineers) 802.11a/B/G, for example, and Bluetooth come into wide use, there is an increasing need for measures against incident electromagnetic waves from outside the electronic devices. Especially, the frequency of the electromagnetic waves ranges from several hundred megahertz (MHz) to several gigahertz (GHz), which is higher than radio and television waves, and because their energy is also high and their wavelength is short, electromagnetic leakage easily occurs. Therefore, utmost caution is called for in taking measures for electromagnetic interference shielding in environment where the devices are close to each other.

FIG. 15 is a cross-sectional view showing an example of a conventional optical semiconductor element.

This optical semiconductor element includes a light-emitting element 101, a light-receiving element 102 that is placed directly opposite to the light-emitting element 101, lead frames 103a and 103b on which the light-emitting element 101 and the light-receiving element 102 are respectively die bonded, a transparent resin portion 104 that covers those portion of the light-emitting element 101, the light-receiving element 102, and the lead frames 103a and 103b where the light-emitting element 101 as well as the light-receiving element 102 are die bonded, and a light-blocking resin portion 105 that covers the surface of the transparent resin portion 104.

In the optical semiconductor element, because the shape of the lead frames 103a and 103b is flat, incident electromagnetic waves from outside, especially from the side, easily reach the light-receiving element 102 and may lead to malfunctioning of the light-receiving element.

In such conventional optical semiconductor elements and the substrates on which the optical semiconductor elements are mounted, various measures have been taken to prevent malfunctions due to electric fields arising from electronic devices or wirings that are close to each other.

For example, as an example of measures taken for the light-receiving element, one measure is that of using a metal shielding wire as a wiring to connect an emitter electrode and another measure is that of forming a transparent conductive film on the emitter electrode installed above the light-receiving element portion in order to protect especially the periphery of a base electrode as well as a base layer region. Source of noise in this case is a rapid displacement of the electric field, and intrusion of electromagnetic waves is prevented by means of dispersing the potential lines across the base portion which includes the base layer and the base electrode on the light-receiving element to the metal shielding wire and to liberate the electric, charge that is subsequently generated inside the metal shielding wire to outside the device.

On the other hand, as an example of measures taken on the exterior of electronic devices in which optical semiconductor elements are mounted, one measure is to prevent release as well as intrusion of electromagnetic waves from outside by completely covering the electronic device with a metal case and the like. Source of noise in this case is electromagnetic waves approaching from far away as a plane wave and the intrusion and release of the electromagnetic wave are prevented by means of taking advantage of the phenomenon that electromagnetic waves absorbed in metal plates are converted to heat inside the metal plates thus blocking the intrusion of electromagnetic waves to electronic parts and optical semiconductor elements.

Generally, the shield effect of metallic lead frames used for conventional electronic devices is such that the skin depth δ for a frame made of copper at high frequencies (of 1 GHz) as are emitted by mobile phones or the like is 2.09 μm. It should be noted that the skin depth δ is given by $\delta=2/\sqrt{(2\pi f\mu\sigma)}$ where f denotes frequency, μ denotes magnetic permeability, and σ denotes conductivity. Therefore, if the thickness of the copper frame is about the same as the thickness of the skin depth, then it is possible to attenuate the electromagnetic waves penetrating the metal plates when electromagnetic waves are irradiated onto the metal plates to 1/e (about 37%) in intensity and 1/e2 (about 13.5%) in power through the attenuation inside the copper frame, provided that the reflection of the electromagnetic wave at the surface is ignored, where e is the energy of the irradiated wave.

Furthermore, if the thickness of the metal plate is 3 times thicker than the skin depth, then it is possible to attenuate the irradiated electromagnetic wave to about 1/20 (−26 dB), and if the thickness of the metal plate is 5 times thicker than the skin depth, then it is possible to attenuate the irradiated electromagnetic wave to about 1/150 (−43 dB). More than enough shield effect is obtained with the thickness of a common lead frame (100 to 200 μm).

Therefore, what is important in protecting against high frequency electromagnetic waves is not the thickness of the shielding, but that the protection is a package equipped with shielding that can protect against electromagnetic waves irradiated from all directions.

FIG. 16 is a cross-sectional view showing an example of a conventional optical semiconductor element equipped with an oxide insulating film as a shield against electromagnetic waves.

The optical semiconductor element is equipped with an oxide insulating film 106 as a metal shield plate on the surface of a light-blocking resin portion 105 and the internal elements are protected by the oxide insulating film 106. However, provided with this structure, electrical insulation between the light-receiving element and the light-emitting element is not possible, and the fundamental ability of the photocoupler, which is to provide electrical insulation between the light-receiving element and the light-emitting element, is lost.

As a conventional structure and method for attenuation of electromagnetic radiation, JP H7-7099A discloses an integrated circuit package as well as a method for attenuating electromagnetic radiation. However, in optical couplers such as photocouplers for which the optical coupler disclosed in JP S62-247575A is a typical example, nothing in particular is mentioned about electromagnetic interference shielding and since the light-emitting element and the light-receiving element are electrically insulated, it is impossible to completely cover the components by metal plates.

In the above-described photocoupler, since no measure is taken against the electromagnetic waves incident from outside, there is the possibility of malfunctioning of the light-receiving element inside.

If the entire component is covered by metal plates, then there is no electrical insulation between the light-receiving element and the light-emitting element, and the basic functionality of the photocoupler is lost. Therefore, the light-emitting element and the light-receiving element must individually be covered by shields. As such a shielding method, it is conceivable to place a shield made of metal or metallic mesh between the light-receiving element and the light-emitting element. But in this case, the optical transmission path is blocked and the transmission efficiency considerably deteriorates.

Therefore, an important point to keep in mind when taking measures against electromagnetic waves incident from outside is how easily loss can be caused by the shield. The loss is divided into three kinds: reflection loss, absorption loss, and loss due to multiple reflection. Reflection loss is the loss at the interface between the surface of the shield and the external medium; it is not affected by the thickness of the shield, and is dependent on the conductivity of the shield. Also, absorption loss is the loss generated by an excess current which in turn is generated as electromagnetic waves pass through the shield; the absorption loss is affected by the thickness of the shield and the material of the shield (magnetic permeability and conductivity). Furthermore, loss due to multiple reflections is the loss that occurs when the electromagnetic waves are repeatedly reflected inside the shield material.

Therefore, if the object is to absorb the electromagnetic waves, then it is preferable that the chip is surrounded in all directions with metal plates with high conductivity such as copper, that reflection loss, absorption loss, and loss through multiple reflections are utilized to the extent possible, and to ensure that there is no path that lets electromagnetic waves reach the light-receiving element.

Since the structure of the lead frames of the conventional photocoupler has many crevices that allow electromagnetic waves to enter, there is the problem that it is not possible to simultaneously achieve an increase in the resistance to noise from electromagnetic waves and to achieve electrical insulation between the light-receiving element and the light-emitting element as well as a high light reception efficiency.

It is thus an object of the present invention to provide an optical semiconductor element equipped with a package that has high absorptive power for external electromagnetic waves as well as an electronic device using this optical semiconductor element by improving the shape of a header of a lead frame on the side of the light-receiving element and by measures in the assembly process.

SUMMARY OF THE INVENTION

In order to achieve the above-described object, the optical semiconductor element of the present invention includes a light-emitting element, a light-receiving element that is placed opposite to the light-emitting element, and two lead frames on which the light-emitting element and the light-receiving element are respectively die bonded; wherein shield plates are arranged on a periphery of a die bonding region of the lead frames and are bent toward the side of the die bonding region's surface. In this case, the shield plates that are formed on the lead frame on the side of the light-receiving element may be bent at an angle less than 90 degrees with respect to the surface of the die bonding region toward the light-emitting element. Also, the shield plates that are formed on the lead frame on the side of the light-emitting element may be bent at an angle more than 90 degrees with respect to the surface of the die bonding region toward the light-receiving element. The material of the lead frames may be copper alloy, iron-nickel alloy, or aluminum alloy that is covered with silver plating.

According to the present invention, it is possible to prevent malfunctioning of the light-receiving element, because electromagnetic waves that are incident from outside do not directly reach the light-receiving element, are blocked by the shield plates and the die bonding regions, and are absorbed or repelled to the outside as reflected waves.

It is also possible to form grooves on the borderlines between the die bonding regions and the shield plates or to form slits on the borderlines between the die bonding regions and the shield plates. Thus, bending the shield plates is made easy, and the bending process is made especially easy when the shield plates are bent at an angle less than 90 degrees. Also, it is possible to prevent the formation of portions unfilled by resin, because if slits are formed, the filling resin easily enters the region enclosed by the shield plates through the slits are formed.

Moreover, the surface of the die bonding region and the shield plates of the lead frame on the side of the light-receiving element on which the light-receiving element is mounted may be roughened and subsequently covered with an electromagnetic wave absorber. This structure in which the surface is roughened and covered with the electromagnetic wave absorber can also be formed on the surface of the die bonding region and the shield plates of the lead frame on the side of the light-emitting element on which the light-emitting element is mounted. With these structures, it is possible to improve the ability to absorb electromagnetic waves and to prevent the electromagnetic waves from reaching the light-receiving element more reliably.

The optical semiconductor element can also be arranged in such a way that the lead terminals of the lead frames are bent so that the light receiving side of the light-receiving element faces a circuit board. With this structural arrangement, it is possible to prevent the electromagnetic waves from reaching the light-receiving element more reliably.

Also, the lead frame on the side of the light-receiving element may be provided with a frame pad that is directly connected to an external terminal for grounding and that has the same width as the width of the die bonding region on which the light-receiving element is die bonded, and this frame pad may be arranged to cover the light-receiving element. Thus, the shield effect is further improved, because the frame pad which makes up a part of a box-shaped external electromagnetic wave shielding package can directly be grounded.

Furthermore, the external terminal and a noise resistant metal wiring that is placed on the light receiving side of the light-receiving element can be electrically connected by wire. Thus, the noise rejection ability of the noise resistant mesh metal wiring on the light-receiving element is improved.

An electronic device according to the present invention uses an optical semiconductor element as described above, thus making it is possible to improve its noise resistance properties.

DESCRIPTION OF THE PREFERRED EMBODIMENTS

Below, embodiments of the present invention are explained with reference to the drawings.

Embodiment 1

Below, Embodiment 1 of the present invention is explained with reference to the drawings.

Figure 1:
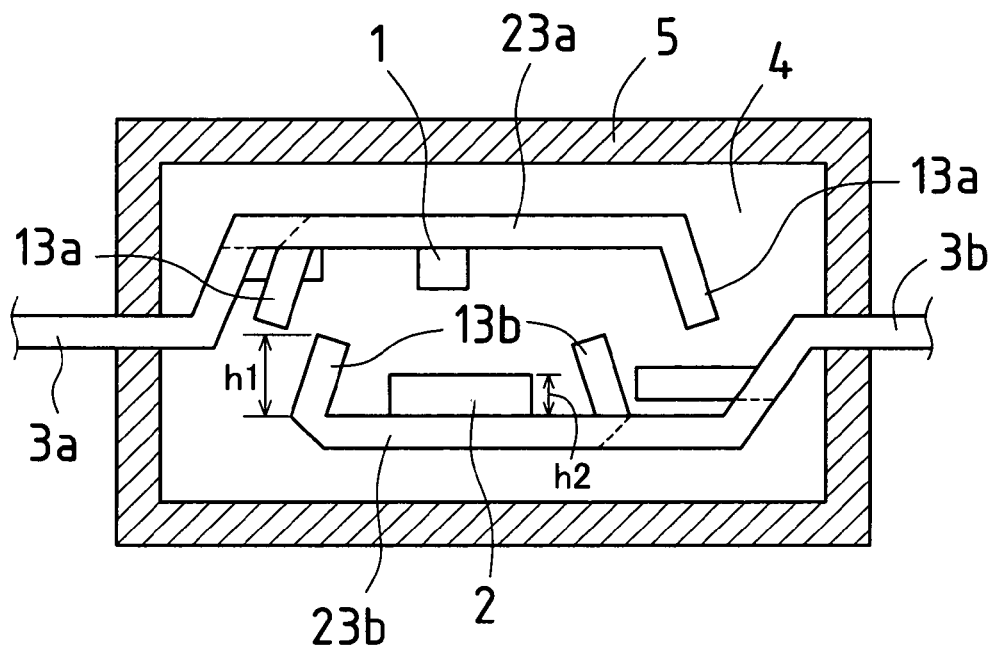
FIG. 1 is a cross-sectional view showing Embodiment 1 of an optical semiconductor element according to the present invention.
Figure 2:
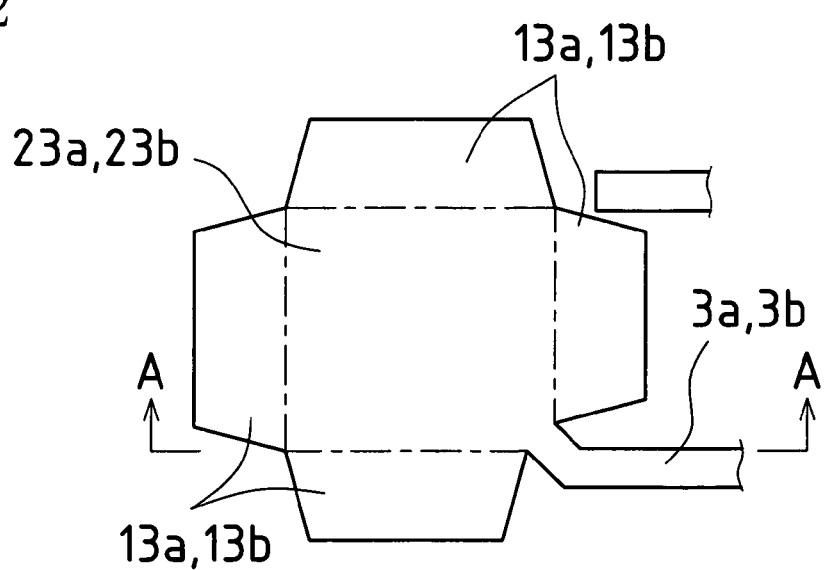
FIG. 2 is a top view showing an example of a header of a lead frame common to the light-emitting element side and the light-receiving element side that is part of the optical semiconductor element shown in FIG. 1.
Figure 3:
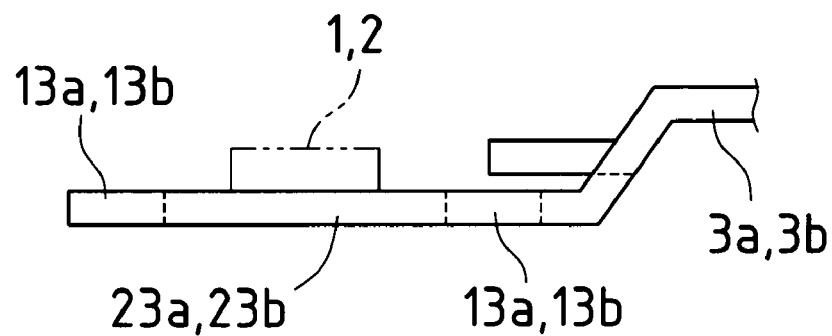
FIG. 3 is a diagrammatic cross-sectional view along the A—A line of FIG. 2.
Figure 4:
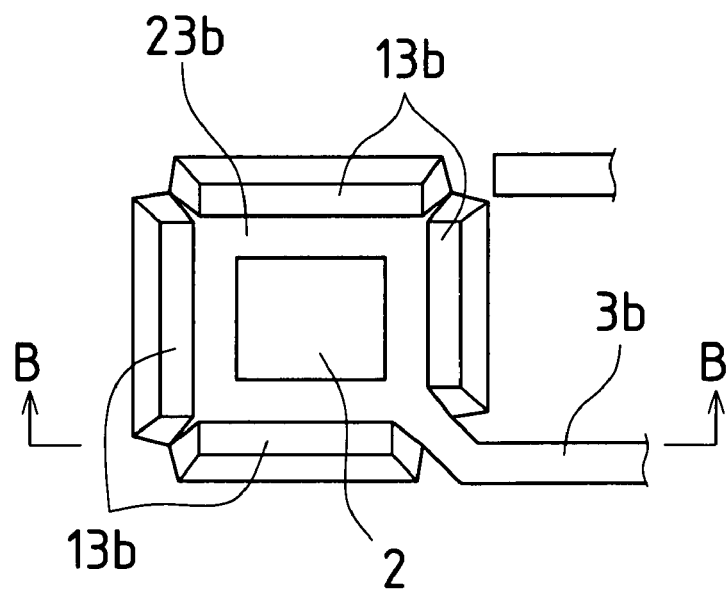
FIG. 4 is a top view showing an example of the header of the lead frame on the side of the light-receiving element, out of the lead frames that make up the optical semiconductor element shown in FIG. 1.
Figure 5:
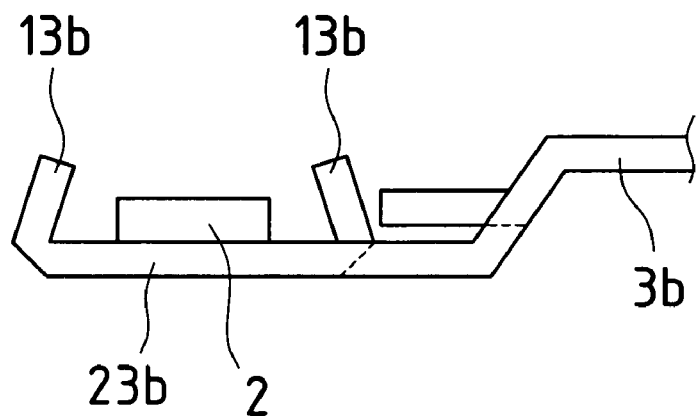
FIG. 5 is a diagrammatic cross-sectional view along the B—B line of FIG. 4.

FIG. 1 is a cross-sectional view showing Embodiment 1 of an optical semiconductor element according to the present invention. Furthermore FIG. 2 is a top view showing an example of a header of a lead frame common to a light-receiving element side and a light-emitting element side that is part of the optical semiconductor element shown in FIG. 1. FIG. 3 is a diagrammatic cross-sectional view along the A—A line of FIG. 2. A shaping step has not been yet performed on the header in FIGS. 2 and 3. Furthermore FIG. 4 is a top view showing an example of the header of the lead frame on the side of the light-receiving element, of the two lead frames that make up the optical semiconductor element shown in FIG. 1. FIG. 5 is a diagrammatic cross-sectional view along the B—B line of FIG. 4. The shaping step has been performed on the header in FIGS. 4 and 5.

The optical semiconductor element of Embodiment 1 includes a light-emitting element 1, a light-receiving element 2 that is placed directly opposite to the light-emitting element 1, lead frames 3a and 3b on which the light-emitting element 1 and the light-receiving element 2 are respectively die bonded, a transparent resin portion 4 that covers those portions of the light-emitting element 1, the light-receiving element 2, and the lead frames 3a and 3b where the light-emitting element 1 and the light-receiving element 2 are die bonded, and a light-blocking resin portion 5 that covers the surface of the transparent resin portion 4. The lead frames 3a and 3b are provided with a portion that functions as an external electromagnetic wave shielding package by bending a part of the headers of both the lead frame 3a on the side of the light-emitting element 1 and the lead frame 3b on the side of the light-receiving element 2 in the shaping step to form shield plates 13a and 13b.

The material for the lead frames 3a and 3b is copper alloy, iron-nickel alloy, or aluminum alloy covered with silver plating, for example. Furthermore, the headers include die bonding regions 23a and 23b whose shape is substantially rectangular (see FIG. 2) and the four shield plates 13a and 13b that are integrally molded to the four sides of the die bonding regions 23a and 23b. The shield plates 13a and 13b are bent at a predetermined angle (this angle is less than 90 degrees (acute angle) for the lead frame 3b on the side of the light-receiving element 2, and more than 90 degrees (obtuse angle) for the lead frame 3a on the side of the light-emitting element 1) toward the side on which the elements are mounted after the light-emitting element 1 and the light-receiving element 2 are respectively die bonded to the die bonding regions 23a and 23b. It should be noted that a state of the shield plates 13b bent at an angle less than 90 degrees (that is, at an acute angle) means a state in which the shield plates 13b are bent inward, beyond the line perpendicular to the die bonding surface of the die bonding region 23b; a state of the shield plates 13a bent at an angle more than 90 degrees (that is, at an obtuse angle) means a state in which the shield plates 13a are bent at an angle prior to the line perpendicular to the die bonding surface of the die bonding region 23a. In other words, the angle in which the shield plates are bent is larger for the shield plates 13b of the light-receiving element 2 than the shield plates 13a of the light-emitting element 1.

In the optical semiconductor element of this embodiment, after the light-emitting element 1 is die bonded to the underside of the die bonding region 23a, the four shielding plates 13a of the lead frame 3a on the side of the light-emitting element 1 are bent downward (towards the side on which the light-emitting element 1 is mounted), and the header consequently is formed to a box structure with its opening facing downward. Similarly, after the light-receiving element 2 is die bonded to the top surface of the die bonding region 23b, the four shield plates 13b of the lead frame 3b on the side of the light-receiving element 2 are bent upward (towards the side on which the light-receiving element 2 is mounted), and the header consequently is formed to a box structure with its opening facing upward.

It should be noted that the height of the shield plates 13b (that is, the distance from the die bonding surface of the die bonding region 23b to the top end of the shield plates 13b after bending) h1 is higher than the height h2 of the light-receiving element 2 (see FIG. 1). Furthermore, it is preferable that the height of the shield plates 13a (that is, the distance from the die bonding surface of the die bonding region 23a to the top end of the shield plates 13a after bending) is set to such a height so that both shield plates 13a and 13b constitute a labyrinth-like structure when the light-emitting element 1 and the light-receiving element 2 are placed directly opposite to each other (that is, to such a height that an electromagnetic wave from outside cannot enter in a straight line).

It is possible to form one box-shaped external electromagnetic wave shielding package by placing the opening portions of the two lead frames 3a and 3b thus formed directly opposite to each other. Therefore, the external electromagnetic wave shielding package can surround the light-receiving element 2 and prevent electromagnetic waves from reaching the light-receiving element 2.

Figure 6:
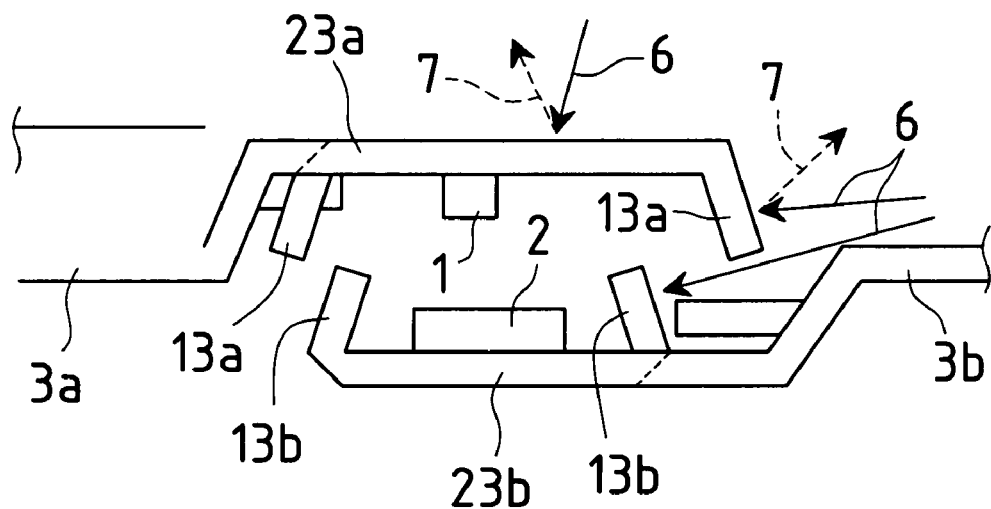
FIG. 6 is a cross-sectional view showing only the lead frame, the light-receiving element, and the light-emitting element of the optical semiconductor element shown in FIG. 1.

FIG. 6 is a cross-sectional view showing only the lead frames, the light-emitting element, and the light-receiving element of the optical semiconductor element shown in FIG. 1. In FIG. 6, the paths of electromagnetic waves from outside are shown as solid arrows and the paths of reflected waves after the electromagnetic waves from outside are reflected on the outer surface of the shield plates and the die bonding region are shown as broken arrows.

Figure 15:
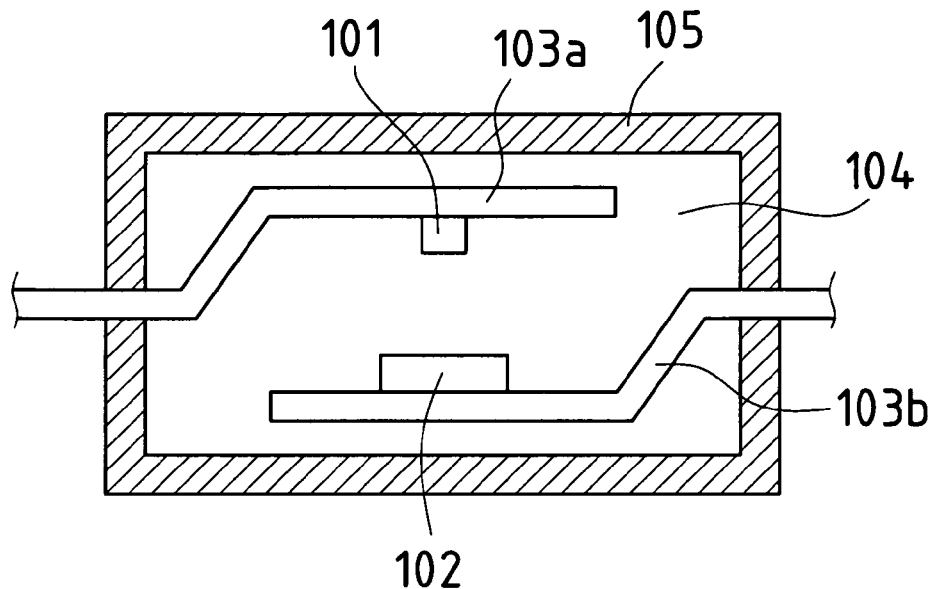
FIG. 15 is a cross-sectional view showing an example of a conventional optical semiconductor element.
Figure 16:
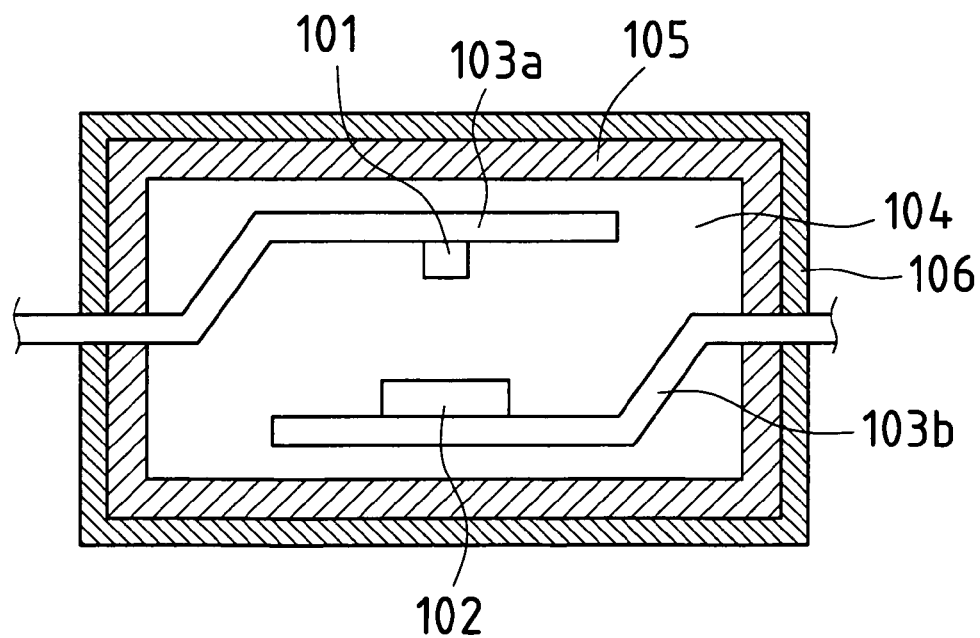
FIG. 16 is a cross-sectional view showing an example of a conventional optical semiconductor element equipped with an oxide insulating film as a shield against electromagnetic waves.

The conventional optical semiconductor element (see FIG. 15) is made only of the headers whose lead frames on which the light-receiving element and the light-emitting element are die bonded is flat. Since the headers have no metal plates that function as the shield plates, in particular electromagnetic waves entering from side easily reach the light-receiving element, which may lead to malfunctioning of the light-receiving element. However, the optical semiconductor element of present embodiment prevents malfunctioning of the light-receiving element, because the electromagnetic waves 6 incident from outside are not directly incident on the light-receiving element 2 and are blocked by the box-shaped headers of the lead frames 3a and 3b (that is, the shield plates 13a and 13b as well as the die bonding regions 23a and 23b), absorbed or reflected to the outside as the reflected waves 7.

Embodiment 2

Below, Embodiment 2 of the present invention is explained with reference to the drawings.

Figure 7:
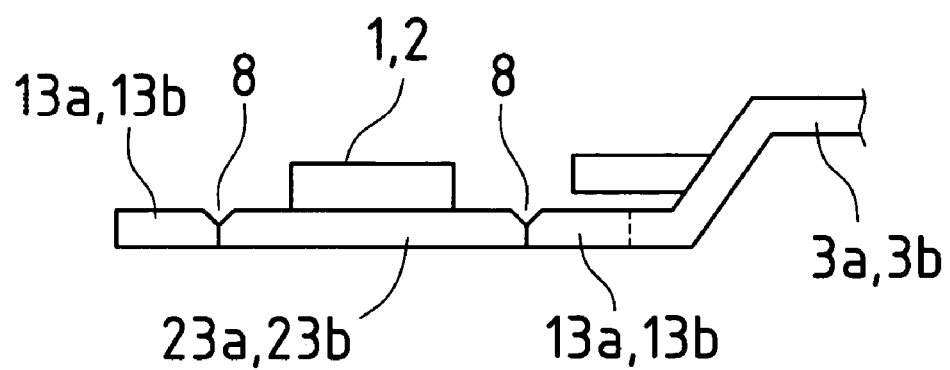
FIG. 7 is a diagrammatic cross-sectional view showing an example of the header of the lead frames common to the light-emitting element side and the light-receiving element side that is part of Embodiment 2 of the optical semiconductor element according to the present invention.
Figure 8:
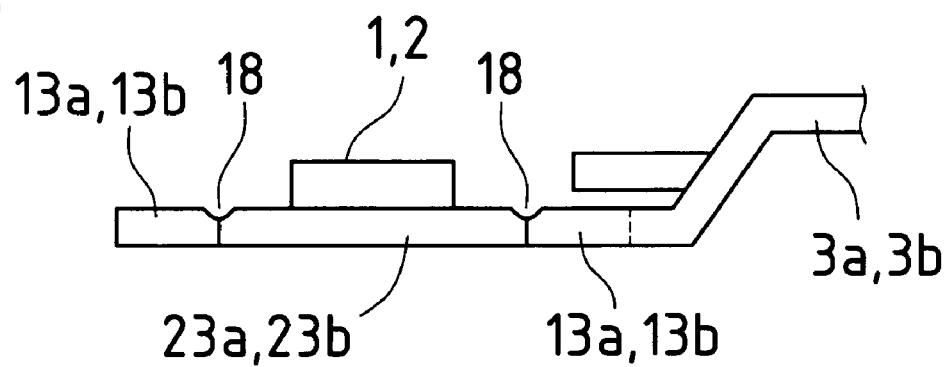
FIG. 8 is a diagrammatic cross-sectional view showing another example of a header of a lead frame common to the light-emitting element side and the light-receiving element side that is part of Embodiment 2 of the optical semiconductor element according to the present invention.

FIG. 7 is a diagrammatic cross-sectional view showing an example of a header of a lead frame common to the light-receiving element side and the light-emitting element side that is part of Embodiment 2 of the optical semiconductor element according to the present invention. FIG. 8 is a diagrammatic cross-sectional view showing other example of a header. It should be noted that in FIGS. 7 and 8 the shaping step has not been yet performed on the headers. Furthermore, FIG. 9 is a diagrammatic cross-sectional view showing the header of the lead frame on the side of the light-receiving element after the shaping step has been performed.

In the optical semiconductor element of the present embodiment, grooves 8 and 18 are formed on bending positions (that is, on the borderlines between the shield plates 13a and 13b and the die bonding regions 23a and 23b) located on the surfaces of the die bonding regions 23a and 23b of the headers on which the light-emitting element 1 and the light-receiving element 2 are die bonded.

The grooves 8, which have a V-shaped cross section, are formed at the bending positions of the header shown in FIG. 7 and the grooves 18, which have a reverse-trapezoid cross section, are formed at the bending positions of the header shown in FIG. 8.

Figure 9:
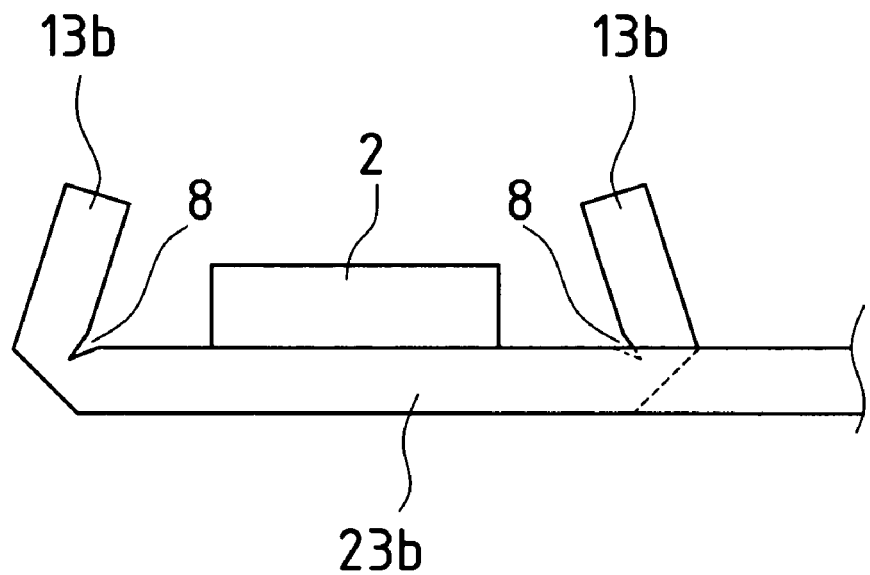
FIG. 9 is a diagrammatic cross-sectional view showing the header of the lead frame on the side of the light-receiving element after the shaping step has been performed.

In the optical semiconductor element of the present embodiment, it is possible to easily bend the shield plates 13b at an angle less than 90 degrees, as shown in FIG. 9, because of this structure.

Embodiment 3

If one box-shaped external electromagnetic shield package is formed with the header of the lead frame on the side of the light-emitting element and the header of the lead frame on the side of the light-emitting element by bending the shield plates at an angle of at least 90 degrees, then, due to this shape, there is the possibility that there are regions at the bent angular portions that are not completely filled with resin when filling the transparent resin by injection molding using a resin molding die. In Embodiment 3, measures are taken to prevent these incomplete resin filling regions. Below, Embodiment 3 of the present invention is explained with reference to the drawings.

Figure 10:
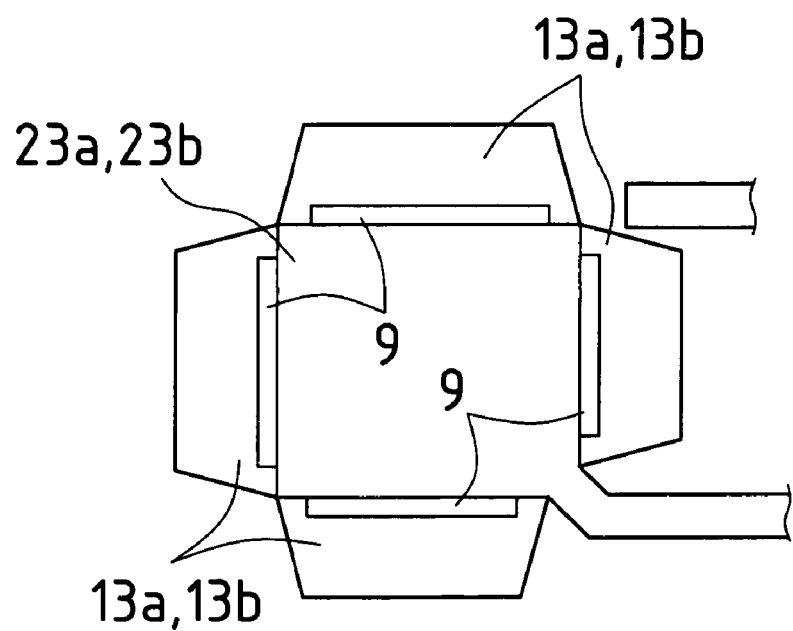
FIG. 10 is a top view showing an example of a header of a lead frame common to the light-emitting element side and the light-receiving element side that is part of Embodiment 3 of the optical semiconductor element according to the present invention.

FIG. 10 is a top view showing an example of a header of the lead frame that is common to the light-receiving element side and the light-emitting element side that make up Embodiment 3 of the optical semiconductor element according to the present invention. The shaping step has not been yet performed on the header in FIG. 10.

In the optical semiconductor element of the present embodiment, slits 9 are formed in the shield plates 13a and 13b along the bending positions of the header.

With this configuration of the optical semiconductor element of the present embodiment, it is possible to eliminate portions not filled with resin because the resin easily enters the region enclosed by the shield plates from the slit 9.

It should be noted that, in the optical semiconductor element of the present embodiment, the grooves 8 and 18 and the slits 9 can be formed on the bending positions of the header, similar to the optical semiconductor element shown in the above-mentioned Embodiment 2.

Embodiment 4

Below, Embodiment 4 of the present invention is explained with reference to the drawings.

Figure 11:
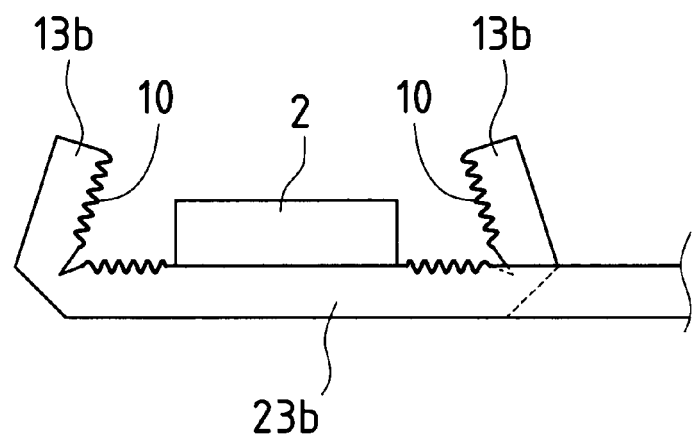
FIG. 11 is a diagrammatic cross-sectional view showing an example of the header of the lead frame on the side of the light-receiving element, out of the lead frames that make up Embodiment 4 of the optical semiconductor element according to the present invention.

FIG. 11 is a diagrammatic cross-sectional view showing, from among the lead frames that make up Embodiment 4 of the optical semiconductor element according to the present invention, an example of the header of the lead frame on the side of the light-receiving element. The shaping step has been performed on the header in FIG. 11.

The optical semiconductor element of the present embodiment is formed by roughening those surfaces of the lead frame that are on the side on which the light-receiving element is mounted (that is, those surfaces of the shield plates 13b and the die bonding region 23b that are on the inner side of the box-shaped external electromagnetic wave shielding package), and covering these roughened surfaces with an electromagnetic wave absorber 10 that is made of magnetic material, for example. It should be noted that, in the optical semiconductor element of the present embodiment, of the surface of the lead frame on the side on which the light-receiving element is mounted the surface of the region in which the light-receiving element is mounted is not roughened and covered with the wave absorber 10.

The optical semiconductor element of the present embodiment can prevent electromagnetic waves from reaching the light-receiving element more reliably because the ability to absorb electromagnetic waves is improved by this configuration.

It should be noted that, in the optical semiconductor element of the present embodiment, the grooves 8 and 18 and the slits 9 can be formed at the bending positions of the header, similar to the optical semiconductor element shown in Embodiment 2.

Furthermore, the present embodiment is explained only for the lead frame on the side of the light-receiving element, but it is preferable that also the lead frame on the side of the light-emitting element has the same configuration. Thus, the ability to absorb electromagnetic waves is further improved and it is possible to prevent electromagnetic waves from reaching the light-receiving element more reliably.

Embodiment 5

Below, Embodiment 5 of the present invention is explained with reference to the drawings.

Figure 12:
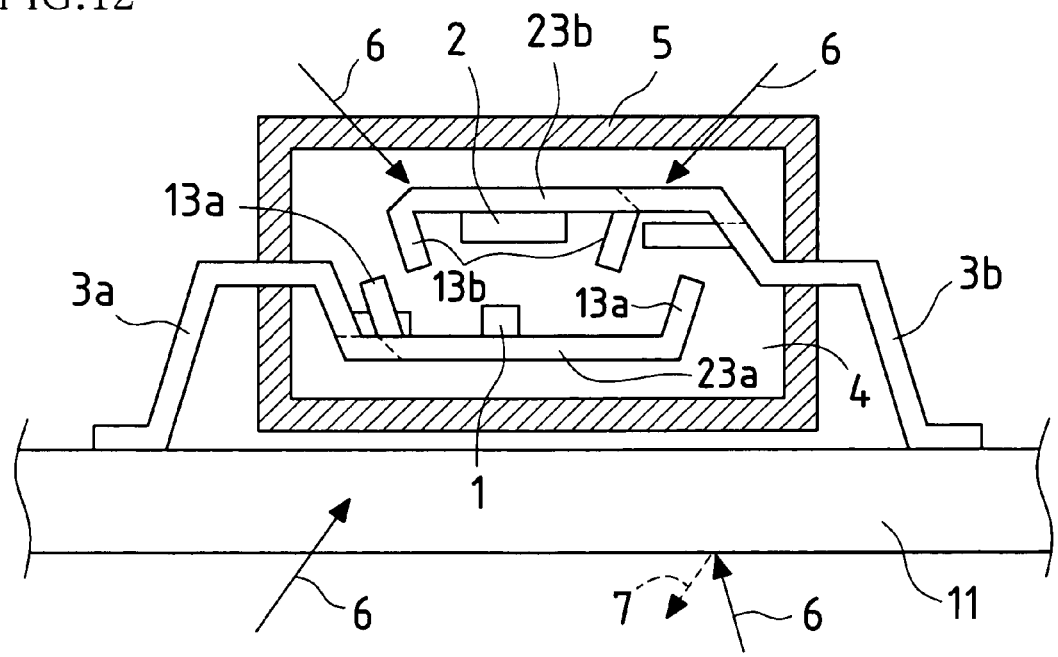
FIG. 12 is a cross-sectional view showing Embodiment 5 of the optical semiconductor element according to the present invention.

FIG. 12 is a cross-sectional view showing Embodiment 5 of the optical semiconductor element according to the present invention.

In the optical semiconductor element of the present embodiment, the lead terminals of the lead frames 3a and 3b are bent so that light receiving side of the light-receiving element 2 faces a circuit board 11, because the lead frame 3b of the light-receiving element 2 that has particularly high shielding effectiveness is used for protection against electromagnetic waves from outside the circuit board 11. Thus, it is possible to arrange the light receiving side of the light-receiving element 2 so that it faces the circuit board 11 by mounting the optical semiconductor element on the circuit board 11 such that the light-emitting element 1 is placed in its lower part and the light-receiving element 2 is placed in its upper part and electrically connecting the wiring pattern (not shown in the drawings) on the circuit board 11 to the lead terminals in contact therewith.

As a result, it is possible to prevent electromagnetic waves from reaching the light-receiving element 2 more reliably, because the electromagnetic waves 6 incident from below the circuit board 11 are mostly absorbed by the circuit board 11 and the electromagnetic waves 6 incident from top are absorbed by the box-shaped header on the side of the light-receiving element 2 (that is, the shield plates 13b and the die bonding region 23b).

It should be noted that, in the optical semiconductor element of the present embodiment, the grooves 8 and 18 and the slits 9 can be formed at the bending positions of the header, similar to the optical semiconductor element shown in Embodiment 2.

Embodiment 6

Below, Embodiment 6 of the present invention is explained with reference to the drawings.

Figure 13:
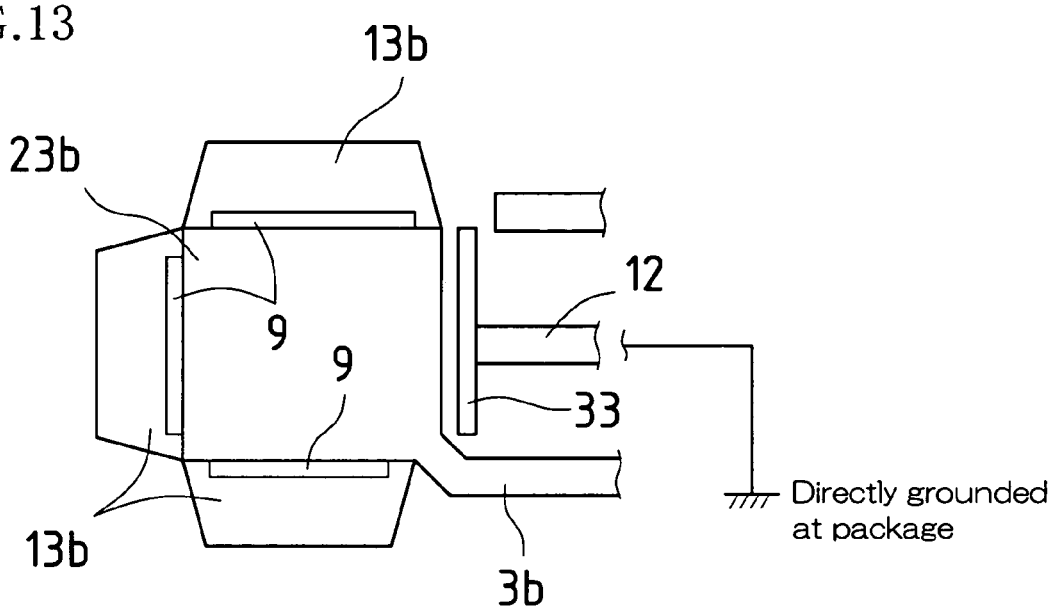
FIG. 13 is a top view showing an example of the header of the lead frame on the side of the light-receiving element, out of the lead frames that make up Embodiment 6 of the optical semiconductor element according to the present invention.

Of the lead frames that make up Embodiment 6 of the optical semiconductor element according to the present invention, FIG. 13 is a top view showing an example of the header of the lead frame 3b on the side of the light-receiving element 2. The shaping step has not yet been performed on the header.

In the lead frame 3b on the side of the light-receiving element of the optical semiconductor element of the present embodiment, a frame pad 33 that is directly connected to an external terminal 12 for grounding has the same width as the width of the die bonding region 23b on which the light-receiving element 2 is die bonded and is arranged to cover the light-receiving element 2.

With this configuration, the optical semiconductor element of the present embodiment can further improve the shielding effect, because the frame pad 33 that makes up a part of the lead frame equipped with the box-shaped external electromagnetic wave shielding package can directly be grounded.

It should be noted that, in the optical semiconductor element of the present embodiment, it is also possible to form the grooves 8 and 18 and the slits 9 at the bending positions of the header, as in the optical semiconductor element shown in Embodiment 2.

Embodiment 7

Below, Embodiment 7 of the present invention is explained with reference to the drawings.

Figure 14:
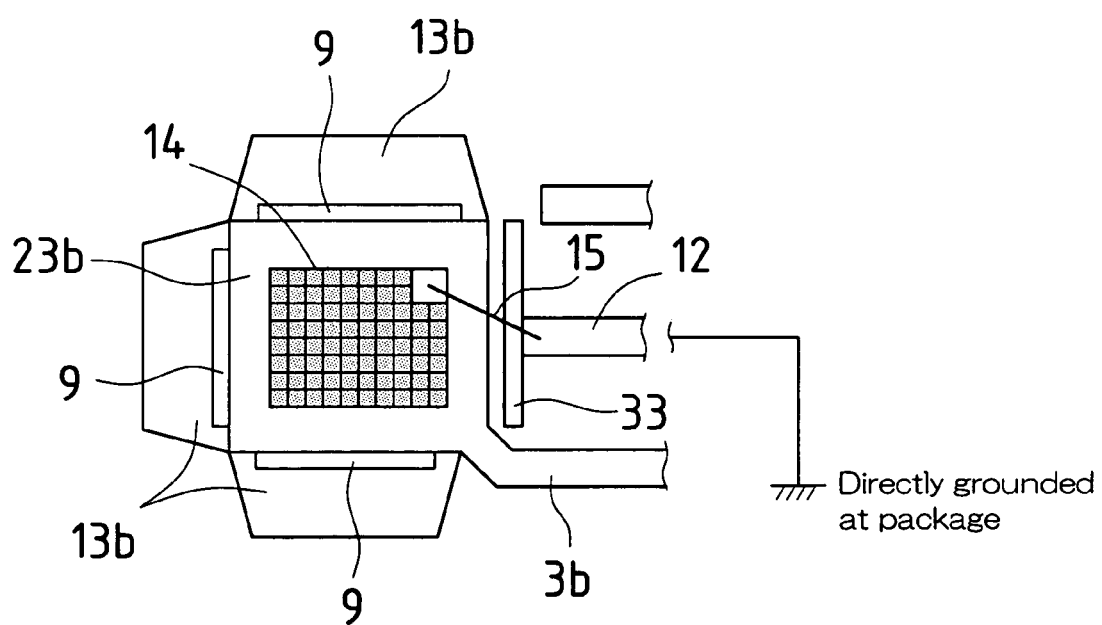
FIG. 14 is a top view showing an example of the header of the lead frame on the side of the light-receiving element, out of the lead frames that make up Embodiment 7 of the optical semiconductor element according to the present invention.

Of the lead frames that make up Embodiment 7 of the optical semiconductor element according to the present invention, FIG. 14 is a top view showing an example of the header of the lead frame 3b on the side of the light-receiving element 2. The shaping step has not yet been performed on the header.

In the optical semiconductor element of the present embodiment, the external terminal 12 for the grounding is electrically connected to noise resistant mesh metal wiring 14 that is placed on the light receiving side of the light-receiving element 2 by wire bonding (wire 15).

With this configuration of the optical semiconductor element of the present embodiment, the noise rejection ability of the noiseproof mesh metal wiring 14 on the light-receiving element 2 is further improved.

It should be noted that it is also possible to form an electronic device using any one of the optical semiconductor element of the above-described Embodiments 1 to 7, thus improving its noise resistance characteristics.

The optical semiconductor element of the present invention may be used as a photocoupler for electronic devices and the electronic devices may be used as a power supply apparatus or as a communication apparatus, for example.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. A semiconductor for optical coupling comprising:
   a light-emitting element;
   a light-receiving element facing the light-emitting element; and
   two lead frames on which the light-emitting element and the light-receiving element are respectively die bonded;
   wherein a periphery of a die bonding region of the lead frames is provided with first and second shield plates angled toward the side of the die bonding region's and wherein the shield plates that are formed on the lead frame on the side of the light-receiving element are bent at an angle less than 90 degrees with respect to the surface of the die bonding region toward the light-receiving element.

2. The semiconductor for optical coupling according to claim 1, wherein the shield plates that are formed on the lead frame on the side of the light-emitting element are bent at an angle more than 90 degrees with respect to the surface of the die bonding region toward the light-receiving element.

3. The semiconductor for optical coupling according to claim 1, wherein the material of the lead frames is copper alloy, iron-nickel alloy, or aluminum alloy that is covered with silver plating.

4. The semiconductor for optical coupling according to claim 1, wherein grooves are formed along borderlines between the die bonding region and the shield plates.

5. The semiconductor for optical coupling according to claim 1, wherein slits are formed along borderlines between the die bonding region and the shield plates.

6. The semiconductor for optical coupling according to claim 1, wherein the surface of the die bonding region and the shield plates of the lead frame on the side of the light-receiving element on which the light-receiving element is mounted is roughened and subsequently covered with an electromagnetic wave absorber.

7. The semiconductor for optical coupling according to claim 1, wherein lead terminals of the lead frames are bent so that a light receiving side of the light-receiving element faces to a circuit board.

8. The semiconductor for optical coupling according to claim 1, wherein the lead frame on the side of the light-receiving element is provided with a frame pad that is directly connected to an external terminal for grounding and that has the same width as the width of the die bonding region on which the light-receiving element is die bonded, and the frame pad is arranged to cover the light-receiving element.

9. The semiconductor for optical coupling according to claim 8, wherein the external terminal is electrically connected by a wire to a noise resistance mesh metal wiring that is placed on the light receiving side of the light-receiving element.

10. An electronic apparatus including the semiconductor for optical coupling according to claim 1.

11. A semiconductor for optical coupling comprising:
a first lead frame having a lead portion and a header having a mounting location;
a light-emitting element mounted on the first lead frame header mounting location;
a second lead frame having a lead portion and a header having a mounting location; and
a light-receiving element mounted on the second lead frame header mounting location and facing said light-emitting element;
wherein at least first and second edges of the first lead frame header or first and second edges of the second lead frame header are bent with respect to the mounting location of the first lead frame header or the second lead frame header to form first and second shielding walls for shielding the light-emitting element or the light-receiving element and
wherein said at least first and second edges of said second lead frame header are bent toward the light-receiving element at an angle of less than 90 degrees.

12. The semiconductor for optical coupling according to claim 11 wherein said light-receiving element includes first, second, third and fourth sides and said second lead frame header includes first, second, third and fourth edges bent to form shielding walls for each of said first, second, third and fourth sides.

13. A semiconductor for optical coupling comprising:
a transparent resin body substantially covered by a light-blocking resin;
a first lead frame extending into the transparent resin body and including a header portion in the transparent resin body having a mounting region having a periphery;
a second lead frame extending into the transparent resin body and including a header portion in the transparent resin body having a mounting region having a periphery;
no more than one light-emitting element in the transparent resin body, said light-emitting element being mounted at the mounting region of the first lead frame header portion;
a light-receiving element in the transparent resin body, said light-receiving element being mounted at the mounting region of the second lead frame header portion;
at least a portion of the periphery of the second mounting region being provided with a shield plate bent at an angle less than 90 degrees toward the light-receiving element.

14. The semiconductor for optical coupling according to claim 13 wherein the shield plate comprises a bent portion of the second lead frame.

15. The semiconductor for optical coupling according to claim 14 wherein the periphery of the mounting region of the second lead frame is angled toward the light-receiving element.

* * * * *